United States Patent
Zarrabian et al.

[19]

[11] Patent Number: 5,838,076
[45] Date of Patent: Nov. 17, 1998

[54] DIGITALLY CONTROLLED TRIM CIRCUIT

[75] Inventors: Morteza Zarrabian, Mountain View; Kenneth J. Carroll, Los Altos, both of Calif.

[73] Assignee: Pacesetter, Inc., Sunnyvale, Calif.

[21] Appl. No.: 749,351

[22] Filed: Nov. 21, 1996

[51] Int. Cl.[6] .............................. H03K 3/01; H01H 19/14
[52] U.S. Cl. ......................... 307/115; 307/125; 326/49; 327/525
[58] Field of Search ..................................... 307/115, 125, 307/98, 151, 112; 323/364, 369, 233, 299, 308; 327/525, 334; 326/49, 50; 370/357, 360, 351, 422

[56] References Cited

U.S. PATENT DOCUMENTS

| | | | |
|---|---|---|---|
| 4,673,866 | 6/1987 | Masuda ..................................... | 323/313 |
| 5,361,001 | 11/1994 | Stolfa ....................................... | 327/530 |
| 5,381,034 | 1/1995 | Thrower et al. ......................... | 257/529 |
| 5,412,594 | 5/1995 | Moyal et al. ............................. | 365/96 |
| 5,459,684 | 10/1995 | Nakamura et al. ...................... | 365/149 |

*Primary Examiner*—William M. Shoop, Jr.
*Assistant Examiner*—Jonathan Kaplan
*Attorney, Agent, or Firm*—Steven M. Mitchell

[57] ABSTRACT

A digitally controlled trim circuit which includes a plurality of resistors connected in series between a circuit node and a reference voltage, a plurality of first solid-state switches (e.g., PMOS transistors) connected in series across respective ones of the resistors, a plurality of multiplexers each having an output coupled to the gate electrode of a respective one of the first switches, a plurality of first control lines coupled to a first input of respective ones of the multiplexers, a plurality of second control lines coupled to a second input of respective ones of the multiplexers, and a plurality of fuses coupled to respective ones of the first control lines. The trim circuit is operable in a trim test mode in response to a first logic level of a select control signal coupled to the select input of each of the multiplexers, and is operable in a fuse-program mode in response to a second logic level of the select control signal.

When the trim circuit is operating in the trim test mode, different combinations of the resistors can be selectively shorted in response to a plurality of trim control bits coupled to the second input of respective ones of the multiplexers. The trim control bits can be stored in a trim register whose contents can be selectively changed to thereby short different combinations of the resistors. When the trim circuit is operating in the fuse-program mode, a selected combination of the resistors can be selected to remain in series by blowing selected ones of the fuses. Preferably, respective ones of the control lines coupled to the selected ones of the fuses which are blown are driven to a first voltage level, e.g., by a pull-down circuit includes a plurality of second solid-state switches (e.g., NMOS transistors) coupled to respective ones of the control lines.

12 Claims, 3 Drawing Sheets

DIGITALLY CONTROLLED TRIM CIRCUIT

BACKGROUND OF THE INVENTION

The present invention relates generally to programmable resistive networks, and more particularly, to a fuse-programmable resistive network with digitally controlled trimming.

With reference now to FIG. 1, there can be seen a schematic diagram of a conventional fuse-programmable resistive network 20. The network 20 includes a plurality of resistors 22A–22E connected in series between a circuit node and a reference voltage (e.g., Vss or ground), and a plurality of corresponding fuses 23A–23E connected in series across (parallel to) respective ones of the resistors 22A–22E. Selected ones of the resistors 22A–22E can be "programmed" into the resistive network 20 by blowing (severing) the respective fuses 23A–23E, to thereby "program" a selected combination of resistors 22A–22E into the resistive network 20. For example, if it is desired to program the resistors 22A and 22E into the resistive network 20, then the corresponding fuses 23A and 23E are blown, the resistors 22B, 22C, and 22D being shunted out of the resistive network 20 by their corresponding fuses 23B, 23C, and 23D.

Typically, the programmable resistive network 20 is employed to trim the value of a selected parameter (e.g., current, voltage, or frequency) of an output signal generated by a circuit coupled to the resistive network 20, e.g., to trim a reference voltage Vref. For this reason, the programmable resistive network 20 is oftentimes referred to as a "trim circuit". Since it is necessary to apply voltages or currents to the fuses in order to sever them, it is further necessary to connect the fuses to I.C. "pads" P. The pads P (the trim points) are connected to an I.C. tester while the I.C. is under test, and are left unconnected during normal circuit operation. During test, the connection of the I.C. tester to the fuses and resistors results in unwanted circuit loading and unwanted injection of electrical noise into the circuit, making accurate trimming difficult. The resistive network or trim circuit 20 is generally programmed in accordance with a design specification after the integrated circuit incorporating the resistive network 20 is fabricated.

A significant drawback of the above-described conventional resistive network is that it is prone or susceptible to coupling of noise into the resistive network during the I.C. test process, due to high impedance at the trim points. Also, the direct connection of an I.C. tester to the resistors can result in circuit instability. With the advent of techniques allowing higher value on-chip resistors, the noise and instability problems can be exacerbated. A significant shortcoming of the above-described conventional resistive network is that it is does not allow testing of different combinations of the resistors in order to optimize the resistive network and thereby the value of the parameter of the output signal of the circuit biased by the resistive network prior to blowing (severing) the fuses to permanently program the network. Thus, if the programmed combination of resistors does not result in the parameter of the output signal having a proper or acceptable value, then the entire chip must be discarded, since the "programming" of the network is irreversible, i.e., it can not be "re-programmed".

Based on the above and foregoing, it can be appreciated that there presently exists a need in the art for a fuse-programmable resistive network or trim circuit which overcomes the above-described drawbacks and shortcomings of the conventional fuse-programmable resistive networks.

SUMMARY OF THE INVENTION

The present invention encompasses a digitally controlled trim circuit which includes a plurality of resistors connected in series between a first reference voltage and a second reference voltage, a plurality of first solid-state switches connected in series across respective ones of the resistors, and facilities for selectively turning on selected ones of the first solid-state switches, to thereby short selected ones of the resistors.

In the presently preferred embodiment of the present invention, the first solid-state switches are MOS transistors, e.g., PMOS transistors. The circuitry for selectively turning on selected ones of the first switches preferably includes a plurality of control lines coupled to the gate electrodes of respective ones of the first switches, a plurality of fuses coupled between respective ones of the control lines and a voltage source, and circuitry for selectively blowing selected ones of the fuses. Respective ones of the control lines coupled to the selected ones of the fuses which are blown are driven to a first voltage level, wherein the first voltage level is suitable to turn on a respective one of the first switches.

The trim circuit preferably further includes a pull-down circuit coupled to the control lines for pulling down the respective ones of the control lines coupled to the selected ones of the fuses which are blown to the first voltage level. In the presently preferred embodiment of the present invention, the pull-down circuit includes a plurality of second solid-state switches, preferably MOS transistors (e.g., NMOS transistors) coupled to respective ones of the control lines, and a pull-down control signal generator for generating a pull-down control signal coupled to the gate electrode of each of the second solid-state switches, the second solid-state switches being turned on in response to the pull-down control signal.

The present invention also encompasses a digitally controlled trim circuit which includes a plurality of resistors connected in series between a first reference voltage and a second reference voltage, a plurality of first solid-state switches (preferably MOS transistors, e.g., PMOS transistors) connected in series across respective ones of the resistors, a plurality of multiplexers each having an output coupled to a control electrode of a respective one of the first switches, a plurality of first control lines coupled to a first input of respective ones of the multiplexers, a plurality of second control lines coupled to a second input of respective ones of the multiplexers, and a plurality of fuses coupled to respective ones of the first control lines.

The trim circuit is operable in a trim test mode in response to a first logic level of a select control signal coupled to the select input of each of the multiplexers, and is operable in a fuse-program mode in response to a second logic level of the select control signal.

When the trim circuit is operating in the trim test mode, different combinations of the resistors can be selectively shorted in response to a plurality of trim control bits coupled to the second input of respective ones of the multiplexers. When the trim circuit is operating in the trim test mode, the output of each of the multiplexers has a first logic level in response to a first logic level of a respective one of the trim control bits, and a second logic level in response to a second logic level of a respective one of the trim control bits. The first switches are turned on in response to the output of a respective one of the multiplexers coupled thereto having the first logic level, and are turned off in response to the output of a respective one of the multiplexers coupled thereto having the second logic level, thereby shorting the resistors coupled across selected ones of the first switches which are turned on. The trim control bits can be stored in a trim register whose contents can be selectively changed to thereby short different combinations of the resistors.

When the trim circuit is operating in the fuse-program mode, a selected combination of the resistors can be shorted by blowing selected ones of the fuses. Preferably, respective ones of the control lines coupled to the selected ones of the fuses which are blown are driven to a first voltage level, e.g., by a pull-down circuit which includes a plurality of second solid-state switches, preferably MOS transistors (e.g., NMOS transistors) coupled to respective ones of the control lines.

BRIEF DESCRIPTION OF THE DRAWINGS

These and other objects, features, and advantages of the present invention will become apparent from the following detailed description taken in conjunction with the accompanying drawings, in which like elements are designated by like numerals in FIGS. 2 and 3, and further, in which.

DETAILED DESCRIPTION OF THE INVENTION

Figure 1:
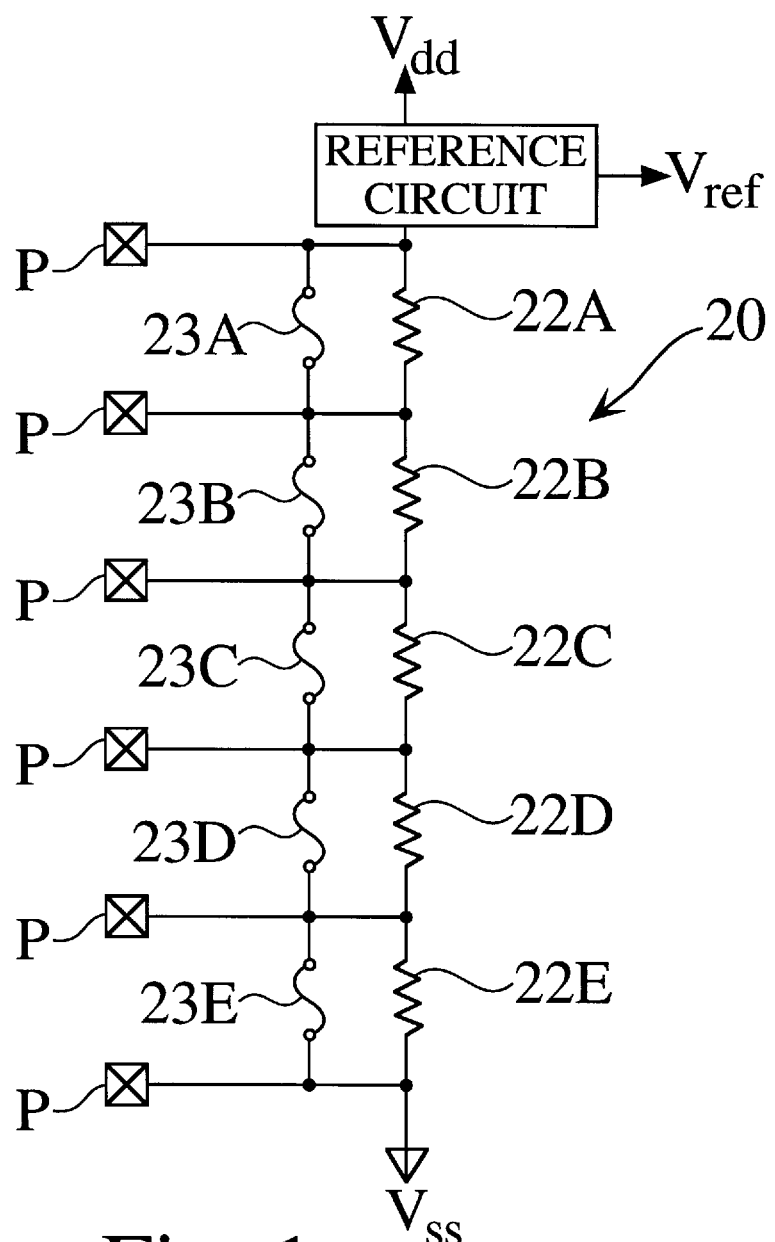
FIG. 1 is a schematic diagram of a conventional fuse-programmable resistive network.
Figure 2:
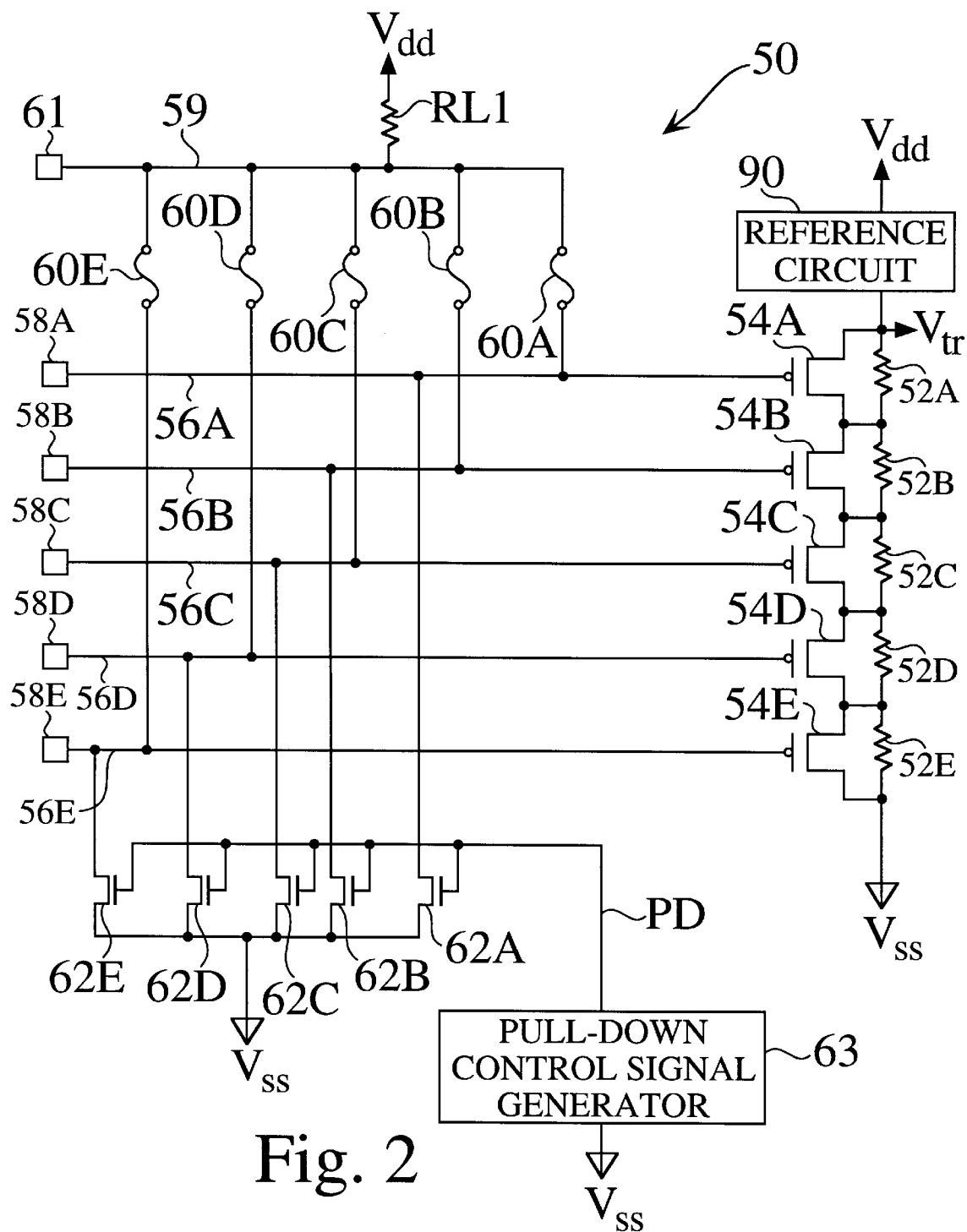
FIG. 2 is a partial schematic, partial block diagram of a fuse-programmable resistive network which is constructed in accordance with the teachings of the present invention; and, FIG. 3 is a partial schematic, partial block diagram of a fuse-programmable resistive network which is constructed in accordance with a presently preferred embodiment of the present invention.

With reference now to FIG. 2, a fuse-programmable resistive network or trim circuit 50 constructed in accordance with the teachings of the present invention will now be described. As can be seen in FIG. 2, the trim circuit 50 includes a plurality of resistors 52A–52E connected in series between an output voltage (e.g., Vtr), and a first reference voltage (e.g., Vss or ground), and a plurality of solid-state switches, e.g., MOS transistor switches (e.g., as shown, PMOS transistors) 54A–54E connected in series across (parallel to) respective ones of the resistors 52A–52E. More particularly, a first electrode of the PMOS transistor switch 54A is connected to a first end of the respective resistor 52A and a second electrode of the PMOS transistor switch 54A is connected to a second end of the respective resistor 52A. The other PMOS transistor switches 54B–54E are connected across respective ones of the resistors 52B–52E in a similar manner, as shown. The resistors 52A–52E can suitably have the same or different resistance values. In general, the resistance values of the resistors 52A–52E are not limiting to the present invention, as they are a matter of design choice.

The gate electrodes of the PMOS transistor switches 54A–54E are coupled to respective control lines 56A–56E. The control lines 56A–56E are coupled to respective control signal input pads 58A–58E. Fuses 60A–60E (e.g., metal fuses) are coupled between a second reference voltage, e.g., Vdd, (either directly, or indirectly via a resistor RL1), and respective ones of the control lines 56A–56E. The resistor RL1 is preferably included so as to limit transient currents through the unblown fuses during normal circuit operation. Without the resistor RL1, the possibility exists that an unblown fuse(s) could be inadvertently severed. Parallel pull-down MOS transistors (e.g., as shown, NMOS transistors) 62A–62E are connected in series between respective ones of the control lines 56A–56E and a second reference voltage (e.g., Vss or ground). The gate electrodes of the pull-down NMOS transistors 62A–62E are commonly coupled to a pull-down control signal PD produced by a pull-down control signal source or generator 63.

In operation, the above-described trim network 50 of the present invention is "programmed" by selectively blowing or severing appropriate ones of the fuses 60A–60E. For example, if it is desired to switch out (short) the resistor 52A from the trim circuit 50, then the corresponding fuse 60A is blown, whereby Vdd is prevented from being applied to the corresponding control line 56A due to the severed (open) fuse 60A. In this connection, the pull-down control signal PD is maintained at a voltage level adequate to pull down the control lines 56A–56E to the first reference voltage Vss. Thus, if the fuse 60A is blown, then since the first electrode of the pull-down transistor 62A will not be coupled to Vdd, the pull-down NMOS transistor 62A will pull down the corresponding control line 56A to Vss. When the control line 56A is tied to Vss, the corresponding PMOS transistor switch 54A will be turned on, and thus, the corresponding resistor 52A will be shorted or switched out of the trim circuit 50. In general, any one or more of the resistors 52A–52E can be selectively shorted by blowing the fuse(s) corresponding thereto.

Although the particular method employed to blow the fuses is not limiting to the present invention, with the specific implementation of the trim circuit 50 depicted in FIG. 2, a selected one of the fuses 60A–60E is blown by means of applying a Vss-level signal to the corresponding one of the control lines 56A–56E via the corresponding one of the control signal input pads 58A–58E, and applying a Vdd signal to the Vdd rail 59 via a program control signal input pad 61, to thereby produce a current of sufficient magnitude to blow the corresponding one of the fuses 60A–60E.

Figure 3:
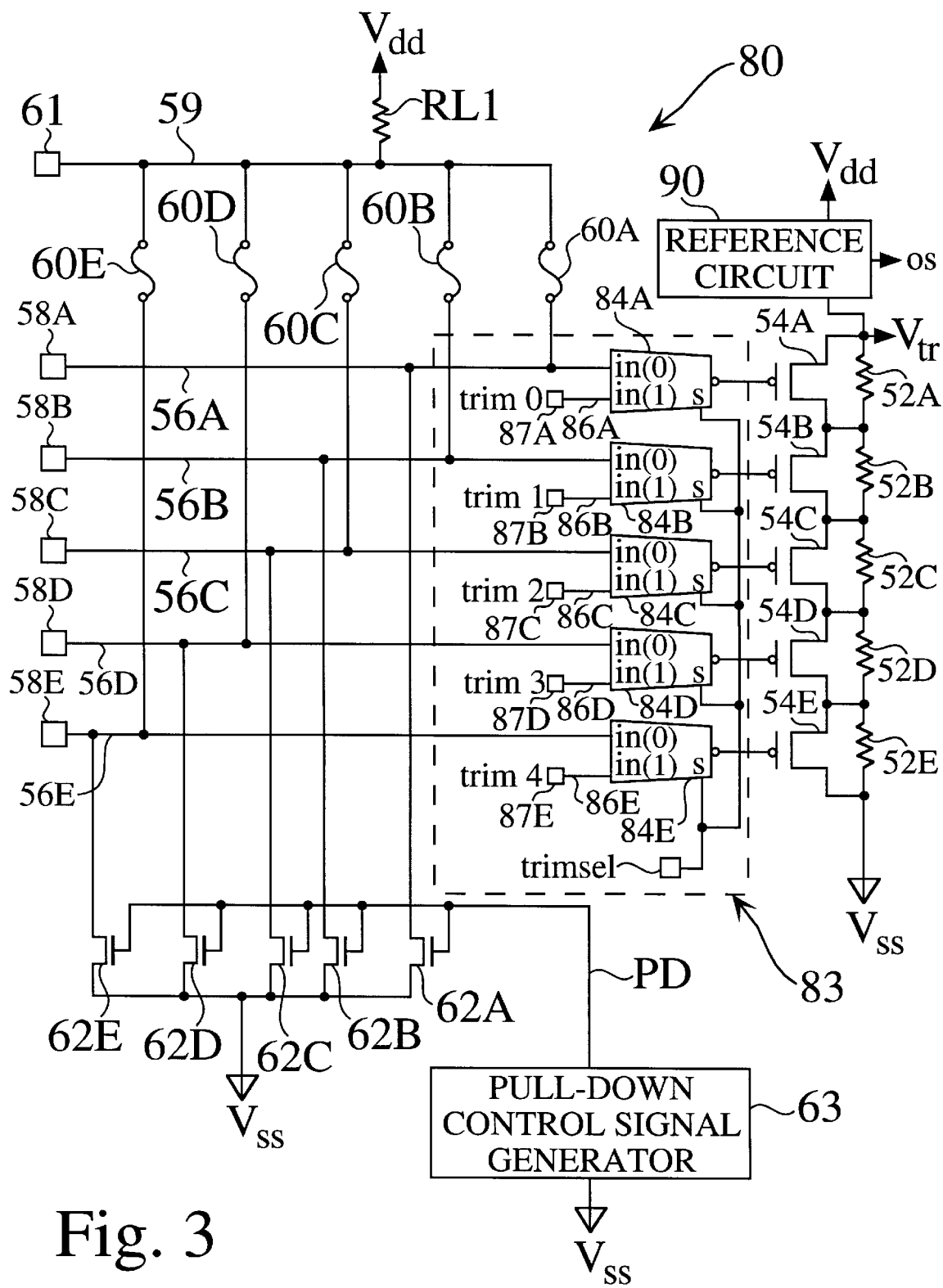

While the trim circuit 50 of the present invention depicted in FIG. 2 and described above constitutes a significant improvement over conventional fuse-programmable trim circuits, the fuse-programmable trim circuit 80 depicted in FIG. 3 provides further enhancements, and thus, constitutes a presently preferred embodiment of the present invention. More particularly, the fuse-programmable trim circuit 80 of the presently preferred embodiment includes, in addition to the circuit elements included in the trim circuit 50 depicted in FIG. 3, a trim test mode circuit 83 which enables all possible combinations of the resistors 52A–52E to be tested prior to selectively blowing the fuses, i.e., prior to "permanently programming" the trim circuit 80.

The trim test mode circuit 83 includes a plurality of multiplexers 84A–84E (e.g., as shown, inverting multiplexers) whose outputs are coupled to the gate electrodes of respective ones of the PMOS transistor switches 54A–54E. The multiplexers 84A–84E each have a first input "in(0)" coupled to a respective one of the control lines 56A–56E, and a second input "in(1)" coupled to a respective one of a plurality of trim control signal lines 86A–86E which are coupled to respective trim control bits "trim0"–"trim4" via respective trim signal input pads 87A–87E. Each of the multiplexers 84A–84E also have a select input "sel" commonly coupled to a trim mode select signal "trimsel". The trim control bits "trim0"–"trim 4" are preferably generated by a trim register (not shown) whose contents can be rapidly changed in order to generate all possible combinations of the trim control bits "trim0"–"trim4" during the trim test mode described below.

With reference now to FIGS. 2 and 3, the trim circuit 80 of the presently preferred embodiment can be operated in a trim test mode by asserting the trim mode select signal "trimsel" to a logic high level, to thereby select the inputs "in(1)" of the multiplexers 84A–84E as the outputs thereof. By selectively changing the logic levels of the trim control bits "trim0"–"trim4" (by changing the contents of the trim register), every possible logical combination of the trim control bits can be applied to the inputs "in(1)" of the multiplexers 84A–84E, to thereby enable testing of a selected parameter (e.g., current, voltage, or frequency) of the output signal "os" produced by the circuit 90 which is biased by the trim circuit 80 for every possible combination of the resistors 52A–52E, e.g., by using a test probe.

In the exemplary implementation depicted in FIG. 3, since there are five trim control bits "trim0"–"trim4", there are $2^5$ (i.e., 32) possible logical combinations of the trim control bits "trim0"–"trim4", corresponding to the 32 possible combinations of the resistors 52A–52E. In the exemplary implementation depicted in FIG. 3, since inverting-type multiplexers 84A–84E are utilized, a logic high level trim control bit applied to the input "in(1)" of a multiplexer results in a logic low level output of that multiplexer, thereby turning on the corresponding one of the PMOS transistor switches 54A–54E to which it is coupled, and thereby switching out or shorting the corresponding one of the resistors 52A–52E. Thus, for example, to test the combination of resistors 52A and 52E, the resistors 52B–52D are shorted by means of asserting trim control bits "trim1"–"trim3" to their logic high level.

The trim test mode is completed when the optimum combination of the resistors 52A–52E is determined. When the trim test mode is completed, the trim circuit 80 is operated in a fuse-programming mode of operation by asserting the trim mode select signal "trimsel" to a logic low level, to thereby select the inputs "in(0)" of the multiplexers 84A–84E as the outputs thereof. In the fuse-programming mode of operation, the trim circuit 80 is "permanently programmed" by selectively blowing the appropriate ones of the fuses 60A–60E in the manner described hereinabove in connection with the discussion of the trim circuit 50 depicted in FIG. 2, with the exception that the inverse logic is employed if the multiplexers 84A–84E are implemented as inverting-type multiplexers, as in the specific implementation of the trim circuit 80 depicted in FIG. 2 (i.e., the fuses corresponding to the resistors which are desired to be "programmed into" the trim circuit 80 are blown, rather than blowing the fuses corresponding to the resistors which are desired to be shorted out of the trim circuit 80).

As will be readily appreciated by those skilled in the pertinent art, the trim circuit 80 of the present invention described above overcomes the previously discussed drawbacks and shortcomings of the conventional fuse-programmable trim circuits. More particularly, the digitally controlled shorting of the resistors (by switching the transistor switches on or off) eliminates the problem of analog noise being introduced to the resistive bias network (which can occur if the resistors are directly connected to I.C. pads), and the capability of testing different combinations of resistors prior to blowing the fuses enables more accurate calibration of the trim circuit than is possible with the conventional fuse-programmable trim circuits, and further, eliminates the problem of discarded chips due to permanent programming of the trim circuit with an unacceptable combination of resistors specified by a predetermined design specification.

Although a presently preferred embodiment and specific implementation of the present invention have been described in detail hereinabove, it should be clearly understood that many variations and/or modifications of the basic inventive concepts herein taught which may appear to those skilled in the pertinent art will still fall within the spirit and scope of the present invention as defined in the appended claims.

For example, although a specific implementation of the present invention depicted in the attached drawings and described herein employ PMOS transistor switches and NMOS pull-down transistors, it will be readily apparent to those skilled in the pertinent art that bipolar transistors (either NPN or PNP transistors) or MOS transistors of the opposite-conductivity type can be used in either or both cases. It will also be readily apparent to those skilled in the pertinent art that non-inverting multiplexers can be employed in lieu of inverting multiplexers. Of course, as will also be readily apparent to those skilled in the pertinent art, any changes in the logic (conductivity) type of the circuit elements of the trim circuit must be accompanied by corresponding changes in the logic (conductivity) type of other cooperative circuit elements of the trim circuit. Obviously, whether positive or negative logic is employed is a matter of design choice.

What is claimed is:

1. A digitally controlled trim circuit, including:
   a plurality of resistors connected in series between a circuit node and a reference voltage;
   a plurality of first solid-state switches connected in series across respective ones of said resistors;
   a plurality of multiplexers each having an output coupled to a control electrode of a respective one of said first solid-state switches, each of said multiplexers having a first input, a second input, and a select input;
   a plurality of first control lines coupled to said first input of respective ones of said multiplexers;
   a plurality of second control lines coupled to said second input of respective ones of said multiplexers;
   a plurality of fuses coupled to respective ones of said first control lines; and,
   wherein the trim circuit is operable in a trim test mode in response to a first logic level of a select control signal coupled to said select input of each of said multiplexers, and is operable in a fuse-program mode in response to a second logic level of said select control signal.

2. The trim circuit as set forth in claim 1, wherein, when the trim circuit is operating in said trim test mode, different combinations of said resistors can be selectively shorted in response to a plurality of trim control bits coupled to said second input of respective ones of said multiplexers.

3. The trim circuit as set forth in claim 2, wherein:
   each of said trim control bits has a first logic level and a second logic level;
   when the trim circuit is operating in said trim test mode, said output of each of said multiplexers has a first logic level in response to said first logic level of a respective one of said trim control bits, and a second logic level in response to said second logic level of a respective one of said trim control bits; and,
   wherein each of said first solid-state switches is turned on in response to said output of a respective one of said multiplexers coupled thereto having said first logic level, and is turned off in response to said output of a respective one of said multiplexers coupled thereto having said second logic level, thereby shorting said resistors coupled across selected ones of said first solid-state switches which are turned on.

4. The trim circuit as set forth in 3, wherein said trim control bits are stored in a trim register whose contents can be selectively changed to thereby short different combinations of said resistors.

5. The trim circuit as set forth in claim 3, wherein, when the trim circuit is operating in said fuse-program mode, a selected combination of said resistors can be selected to remain in series by blowing selected ones of said fuses.

6. The trim circuit as set forth in claim 3, wherein, when the trim circuit is operating in said fuse-program mode, a selected combination of said resistors can be shorted by blowing selected ones of said fuses.

7. The trim circuit as set forth in claim 1, wherein, when the trim circuit is operating in said fuse-program mode, a selected combination of said resistors can be shorted by blowing selected ones of said fuses.

8. The trim circuit as set forth in claim 1, wherein, when the trim circuit is operating in said fuse-program mode, a selected combination of said resistors can be selected to remain in series by blowing selected ones of said fuses.

9. The trim circuit as set forth in claim 8, wherein respective ones of said control lines coupled to said selected ones of said fuses which are blown are driven to a first voltage level.

10. The trim circuit as set forth in claim 9, further comprising a pull-down circuit coupled to said control lines for pulling down to said first voltage level said respective ones of said control lines coupled to said selected ones of said fuses which are blown.

11. The trim circuit as set forth in claim 10, wherein said pull-down circuit includes:

a plurality of second solid-state switches coupled to respective ones of said control lines, each of said second solid-state switches having a control electrode; and, a pull-down control signal generator for generating a pull-down control signal coupled to said control electrode of each of said second solid-state switches, said second solid-state switches being turned on in response to said pull-down control signal.

12. The trim circuit as set forth in claim 8, wherein each of said fuses has a first end coupled to said circuit node, and a second end coupled to a respective one of said control lines.

* * * * *